United States Patent
Grondalski et al.

(12)
(10) Patent No.: US 6,348,824 B1
(45) Date of Patent: Feb. 19, 2002

(54) HIGH SPEED STATIC LATCH

(75) Inventors: Bob Grondalski, Austin, TX (US); Pranjal Srivastava, Los Gatos; James Vinh, San Jose, both of CA (US)

(73) Assignee: Fujitsu, Limited, Kanagawa (JP)

( * ) Notice: Subject to any disclaimer, the term of this patent is extended or adjusted under 35 U.S.C. 154(b) by 0 days.

(21) Appl. No.: 09/627,973

(22) Filed: Jul. 28, 2000

(51) Int. Cl.[7] .............................................. H03K 3/037
(52) U.S. Cl. ...................... 327/201; 327/208; 327/218
(58) Field of Search ................................ 327/199–203, 327/208–212, 218

(56) References Cited

U.S. PATENT DOCUMENTS 6,107,852 A * 8/2000 Durham et al. ............. 327/211
6,211,713 B1 * 4/2001 Uhlmann .................... 327/211
6,239,640 B1 * 5/2001 Liao et al. .................. 327/218

* cited by examiner

Primary Examiner—Tuan T. Lam
(74) Attorney, Agent, or Firm—Fenwick & West, LLP

(57) ABSTRACT

A static latch includes two individual data paths. A first data path is used for passing the data on an output driver for driving a voltage level at the output from the latch toward a logic high or logic low voltage level depending upon the data. A second data path is used for storing the data in a feedback sturcutre so the latch can continue to drive the voltage level at the output node until the next data is loaded into the latch.

6 Claims, 1 Drawing Sheet

HIGH SPEED STATIC LATCH

FIELD OF THE INVENTION

The invention relates to high speed data latches. More specifically the invention relates to a high speed data latch having a reduced delay time.

BACKGROUND

Latches are well known in the art and are often used for buffering or temporarily storing data in computer systems. A standard static latch uses a single data path having a transmission gate, a feedback structure and an output driver. The transmission gate is coupled to receive data and a clock signal CLK. The transmission gate will allow the data pass through the gate and into the latch when the clock signal CLK is active. As the data passes through the transmission gate, the feedback structure is first loaded with the data as it passes through the single data path. The data is then passed through an output driver, where it drives an output Q from the latch. When the clock signal CLK is inactive, the data stored in the feedback structure continues to pass through the output driver and drive the output Q from the latch. This feedback structure prevents any feedback through the driver from corrupting the data in the latch and leading to an erroneous output while the clock signal CLK is inactive.

FIG. 1 illustrates a conventional static latch structure 101. As shown, the conventional static latch 101 consists of a single data path having a transmission gate 105, a feedback structure 110, and an output driver 115. In FIG. 1, the output driver 115 illustrated is a non-inverting output driver, although it is understood that the output driver may be either inverting or non-inverting. The transmission gate 105 is coupled to receive data at the input D. The transmission gate 105 is also coupled to receive a clock signal CLK and an inverted version of the clock signal $\overline{\text{CLK}}$. When the clock signal CLK is active and the inverted clock signal $\overline{\text{CLK}}$ is inactive, the transmission gate 105 operates in a forward flow mode and data passes from the input D through the gate 105.

The conventional static latch 101 also includes a feedback structure 110, comprised of two inverters 111 and 112 arranged in a loop. As data passes through the transmission gate 105, it flows along the first data path and is loaded into the feedback structure 110. The feedback structure 110 stores data in the latch until the next time the clock signal CLK is active and prevents any feedback though the driver 115 from invalidating the data in the latch, thereby preventing errors at the output. Finally, the data is inverted and passed through the output driver 115, where it is amplified for driving a voltage at the output Q toward a logic high or logic low voltage level.

One major drawback to this structure is delay. The use of a single data path requires that the feedback structure 110 be loaded with the data before it is provided to the output driver 115, for driving the output node. The delay required to load the feedback structure 110 slows the propagation of data through the static latch 101. What is needed is a latch design which performs more quickly and does not include the significant delays inherent in the prior art.

SUMMARY OF THE INVENTION

The present invention is for a new static latch structure which has a significantly reduced delay time. In a first aspect, the new static latch includes two individual data paths. A first data path is used for passing the data to an output driver for driving a voltage level at the output from the latch toward a logic high or logic low voltage level depending upon the data. A second data path is used for storing the data in a feedback structure so the latch can continue to drive the voltage level at the output node until the next data is loaded into the latch.

In a further aspect, the conventional output driver found in prior art static latches is replaced with a tri-state driver. The tri-state driver allows the data stored in the feedback structure to continue to drive the voltage level at the output node while preventing feedback from corrupting data stored in the latch. The use of a tri-state driver eliminates that need for a feedback structure in the first data path because the data cannot be corrupted by feedback through the tri-state driver and into the first data path since there is no flow from the source to the gate of the tri-state driver.

By moving the feedback structure into a separate data path, a much faster static latch can be implemented that is useful in circuits where local latching is required. In fact, by moving the feedback structure into a second data path, up to 75% of the delays associated with traditional static latches is eliminated.

DETAILED DESCRIPTION

Figure 1:
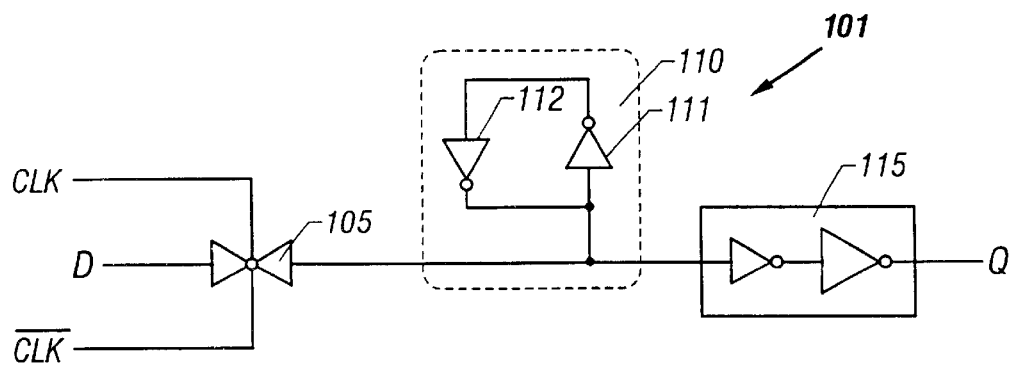
FIG. 1 illustrates a conventional static latch structure.
Figure 2:
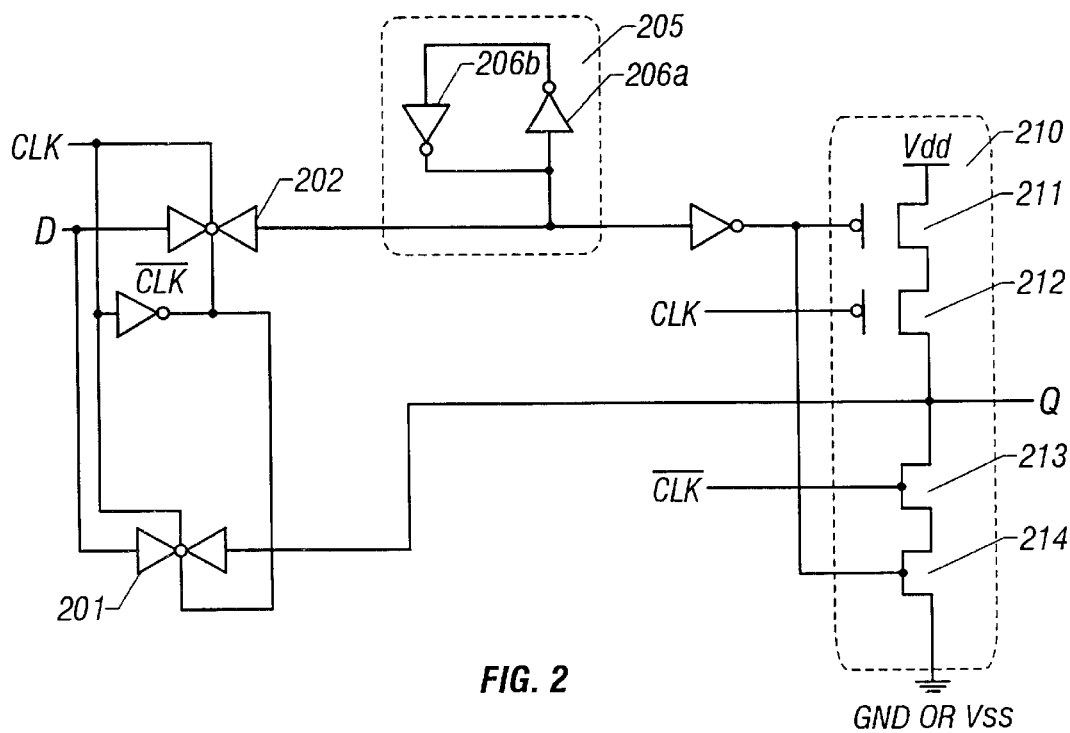
FIG. 2 illustrates a static latch structure in accordance with a preferred embodiment of the present invention.

FIG. 2 illustrates a data latch structure in accordance with a preferred embodiment of the present invention. As shown, the latch includes first and second transmission gates 201 and 202. Each of the transmission gates 201 and 202 is coupled to receive a clock signal CLK and an inverted clock signal $\overline{\text{CLK}}$. The gates are active when the clock signal CLK is high and are inactive when the clock signal CLK is low.

Both transmission gates 201 and 202 are also coupled to receive input data D. The first transmission gate 201 is coupled to receive the input data D and pass the data through a first data path of the latch when the clock signal CLK is high. The second transmission gate 202 is coupled to receive the input data D and pass the data through a second data path of the latch when the clock signal CLK is high. The first data path leads directly to an output Q of the latch. The second data path leads to a feedback loop 205 for storing the input data. Accordingly, the feedback loop 205 is in a second path, separate and apart from the first data path.

The present invention reduces the delay associated with passing the data through the static latch which would be inherent in prior art implementations. When the clock signal CLK is high, data passes through the transmission logic gate 201, down the first transmission path, directly to the output Q. The data also passes through the second transmission logic gate 202, down the second transmission path, and into the feedback loop 205. Since the feedback loop 205 is not directly in the first data path, the data can quickly pass from the input through the first transmission gate, and to the output Q without having to wait for the feedback loop 205 to load or for the driver 210 to drive the output node. Accordingly, the delay in the second data path does not affect the first data path.

As shown in FIG. 2, the second data path leads to a feedback loop 205 for storing the data in the latch and keeping the output Q valid until the next clock signal. The feedback loop 205 is preferably comprised of a pair of inverters 206a and 206b which are coupled serially in a loop. As explained earlier, the feedback loop 205 is in a second data path, and is loaded at the same time the data passes through the first data path. This significantly reduces delay times associated with prior art data latch designs where data is first loaded into the feedback loop before it passes to the output node Q.

As further shown in FIG. 2, the latch further includes a tri-state driver 210 coupled between the feedback loop 205, the first transmission gate 201, and the output Q. The tri-state driver is comprised of four transistors 211, 212, 213 and 214, coupled serially between a high voltage rail Vdd and a ground or low voltage rail Vss. Transistors 211 and 212 are P type transistors and are serially coupled between the high voltage rail Vdd and the output node Q. Transistors 213 and 214 are N type transistors and are serially coupled between the output Q and the ground or low voltage rail Vss.

Transistor 211 has its drain coupled to the high-voltage rail Vdd, its source coupled to the drain of transistor 212, and its gate coupled to receive the inverted output of the feedback loop 205. Transistor 212 has its drain coupled to the source of transistor 211, its source coupled to the output Q, and its gate coupled to receive the clock signal CLK. Transistor 213 has its source coupled to the output Q, its drain coupled to the source of transistor 214, and its gate coupled to receive the inverted clock signal $\overline{CLK}$. Transistor 214 has its source coupled to the drain of transistor 213, its drain coupled to the ground or low-voltage rail Vss, and its gate coupled to receive the inverted output of the feedback loop 205.

When the clock signal CLK is low and the inverted clock signal $\overline{CLK}$ is high, the transistors 212 and 213 are both enabled. In this way, the tri-state driver is configured to drive the voltage at the output node up or down, depending upon the data stored in the feedback loop 205, when the clock signal CLK is low and the inverted clock signals $\overline{CLK}$ is high. If the data stored in the feedback loop is a high-voltage value, then transistor 211 turns on and transistor 214 turns off. This creates a current path from the high voltage rail Vdd to the output Q, driving the voltage level at the output Q toward the high voltage rail, and thereby maintaining a high voltage at the output Q. Alternatively, if the data stored in the feedback loop is a low voltage value, then transistor 211 turns off and transistor 214 turns on. This creates a current path from the output Q to the ground or low voltage rail Vss, causing the voltage level at the output Q to be maintained at a logic low level as the voltage is driven toward the ground or low voltage rail Vss. Accordingly, the use of a tri-state driver 210 allows the data to pass directly to the output Q when the clock signal CLK is high, while allowing data stored in the feedback loop 205 to drive the voltage level at the output Q when the clock signal CLK is low.

The above description is only intended to illustrate one preferred embodiment and other embodiments may exist. Accordingly, the present invention is understood to be limited by the scope of the subsequent claims only, and not inherently limited by the details of the preferred embodiments disclosed above.

What is claimed is:

1. A static latch for receiving, storing and outputting a data voltage value, the latch comprising:

an output;

a first transmission gate coupled to receive the data voltage value and a clock signal, the first transmission gate passing the data voltage value toward the output when the clock signal is in a first state;

a feedback loop coupled in parallel with the first transmission gate for receiving and storing the data voltage value when the clock signal is in the first state, and passing the stored data voltage value toward the output when the clock signal is in a second state; and a tri-state driver coupled between the first transmission gate, the feedback loop and the output, the tri-state driver allowing the data voltage value to pass directly from the first transmission gate to the output when the clock signal is in the first state, thereby driving the output voltage level at the output toward the data voltage value when the clock signal is in the first state, said tri-state drive further receiving the data voltage value stored in the feedback loop for driving the output toward the data voltage value when the clock signal is in the second state.

2. The latch of claim 1 further comprising:

a second transmission gate coupled to receive the data voltage value and the clock signal, passing the data voltage value toward the feedback loop when the clock signal is in the first state.

3. The latch of claim 1 further comprising:

an inverter coupled between the feedback loop and the tri-state driver for inverting the data voltage value before it is received by the tri-state driver.

4. A method for latching data in a high speed static latch in order to drive an output node of the latch, the method comprising:

receiving a first data value when the high speed static latch is in a first state;

simultaneously using the first data value received to drive the output node while latching the first data value in a feedback loop of the high speed static latch; and using the first data value stored in the feedback loop of the high speed static latch to continue to drive the output node when the high speed static latch is in a second state.

5. A data latch for latching data comprising:

a first data path for receiving data when the latch is in a first state, and immediately providing the data toward an output of the latch when the latch is in the first state; and a second data path for receiving and storing data when the latch is in the first state, and providing the stored data toward an output of the latch when the latch is in a second state.

6. The data latch of claim 5, further comprising:

a tri-state driver coupled to receive the data from the first data path and the second data path, the tri-state driver using the data from the first data path to drive the output of the latch when the latch is in the first state, and using the data from the second data path to drive the output of the latch when the latch is in the second state.

* * * * *